United States Patent [19]
Fuesser et al.

[11] Patent Number: 5,785,876
[45] Date of Patent: Jul. 28, 1998

[54] LAYER CONSTRUCTION WITH AN ORGANIC LAYER AND A TRANSPARENT COVER LAYER WHICH IS HARDER THAN THE ORGAN LAYER AND PROCESS FOR ITS PRODUCTION

[75] Inventors: Hans-Juergen Fuesser, Gerstetten; Karl Holdik, Beimerstetten; Klaus Rohwer, Ulm; Martin Hartweg, Erbach, all of Germany

[73] Assignee: Daimler-Benz AG, Stuttgart, Germany

[21] Appl. No.: 847,666

[22] Filed: Apr. 22, 1997

Related U.S. Application Data

[62] Division of Ser. No. 499,560, Jul. 7, 1995, Pat. No. 5,656,363.

[30] Foreign Application Priority Data

Jul. 7, 1994 [DE] Germany ............... 44 23 891.6

[51] Int. Cl.$^6$ ............................................. B05D 3/00
[52] U.S. Cl. ............... 216/58; 216/95; 427/307; 427/322; 427/536; 427/577; 427/596; 427/248.1; 427/249; 427/255.3; 427/255.6; 427/255.7; 427/407.1; 427/410; 427/419.1; 427/419.5; 427/419.7; 427/444
[58] Field of Search ............... 216/58, 95; 427/307, 427/322, 536, 577, 596, 248.1, 249, 255.3, 255.6, 255.7, 407.1, 410, 419.1, 419.5, 419.7, 444

[56] References Cited

U.S. PATENT DOCUMENTS

| | | | |
|---|---|---|---|
| 4,975,328 | 12/1990 | Hirose et al. | 428/413 |
| 5,059,502 | 10/1991 | Kojima et al. | 430/66 |
| 5,211,995 | 5/1993 | Kuehnle et al. | 427/570 |
| 5,223,765 | 6/1993 | Staron et al. | 313/478 |
| 5,397,558 | 3/1995 | Miyanaga et al. | 423/441 |
| 5,425,965 | 6/1995 | Tamor et al. | 427/249 |
| 5,455,072 | 10/1995 | Bension et al. | 427/255.7 |
| 5,462,776 | 10/1995 | Gruen | 427/577 |
| 5,485,804 | 1/1996 | Adair et al. | 117/90 |
| 5,628,920 | 5/1997 | Fuesser et al. | 216/58 |

*Primary Examiner*—Archene Turner
*Attorney, Agent, or Firm*—Evenson, McKeown, Edwards & Lenahan P.L.L.C.

[57] ABSTRACT

A layer construction with an organic layer and a transparent cover layer which covers the organic layer and which is harder than the organic layer, and a process for producing such a layer construction in which the cover layer is deposited on the surface of the organic layer from a precursor material present in the gas phase. In order to improve the optical quality of the layer construction, the cover layer, at least in a transition region between the organic layer and the cover layer, is deposited with an index of refraction which differs by a maximum of 20%, in particular by a maximum of 10%, from the index of refraction of the underlying organic layer.

19 Claims, 2 Drawing Sheets

LAYER CONSTRUCTION WITH AN ORGANIC LAYER AND A TRANSPARENT COVER LAYER WHICH IS HARDER THAN THE ORGAN LAYER AND PROCESS FOR ITS PRODUCTION

This application is a division of co-pending application Ser. No. 08/499,560, filed Jul. 7 1995, now U.S. Pat. No. 5,656,363.

BACKGROUND OF THE INVENTION

The invention relates to a layer construction with an organic layer and a further transparent layer which covers the organic layer and is harder than the organic layer. The invention also relates to a process for producing this layer construction comprising an organic layer and a cover layer which covers the organic layer and which is harder than the organic layer in which the organic layer to be covered with the cover layer first is cleaned and then the cover layer is deposited by chemical vapor deposition on the surface of the organic layer from a precursor material present in the gas phase.

Kuehnle et al., U.S. Pat. No. 5,211,995 discloses a process for covering organic surfaces with a layer which is harder than the organic layer. In this process, a cover layer formed preferably of titanium nitride ($TiN_2$) or silicon nitride ($Si_3N_4$) is applied by means of a CVD (Chemical Vapor Deposition) process on top of an organic layer which, for example, may be a clear finish lacquer of a sheet of metal painted with colored lacquer. For this purpose, the painted sheet metal is cleaned, introduced into a reactor, the reactor is evacuated, a gas comprising a precursor—hereinafter referred to as precursor material—is introduced and the precursor material is energetically excited. When process parameters are appropriately adjusted, the cover layer then deposits on the surface of the organic layer, i.e. on the clear lacquer. A layer construction of this type, however, exhibits a surface with an optically irregular appearance, so that it cannot be used to produce high value products. Also the durability of the cover layer toward chemical and mechanical influences is less than the theoretically expected values.

SUMMARY OF THE INVENTION

It is the object of the invention to further develop the layer construction of this type such that the optical quality of the layer construction is improved.

It is also an object of the invention to provide a process for producing a multi-layer article of the foregoing type.

The objects of the invention are achieved in accordance with a first aspect of the invention by providing a multilayer article comprising an organic layer and an adjoining transparent cover layer which covers the organic layer and which is harder than the organic layer, in which at least in a transition region where the cover layer joins the organic layer, the cover layer has an index of refraction which is within 20% of that of the organic layer.

In accordance with a further aspect of the invention, the objects are achieved by providing a process for producing a multi-layer article comprising an organic layer and an adjoining cover layer which covers the organic layer and which is harder than the organic layer, comprising cleaning the organic layer, and depositing the cover layer on the cleaned organic layer by chemical vapor deposition of a precursor material from a gas phase, the cover layer being deposited at least in a transition region where the cover layer joins the organic layer with an index of refraction which is within 20% of that of the underlying organic layer.

By accommodating or matching the index of refraction of the cover layer to the index of refraction of the organic layer, the intensity of the light which is reflected with the transit time difference or path difference and which forms the Newtonian rings is small, so that these either cannot be detected at all by a human eye or can only be perceived with difficulty.

Advantageous further embodiments and features of the invention are described hereinafter.

BRIEF DESCRIPTION OF THE DRAWINGS

The invention will be described in further detail hereinafter with reference to illustrative preferred embodiments shown in the accompanying drawings in which.

DETAILED DESCRIPTION OF PREFERRED EMBODIMENTS

Figure 1:
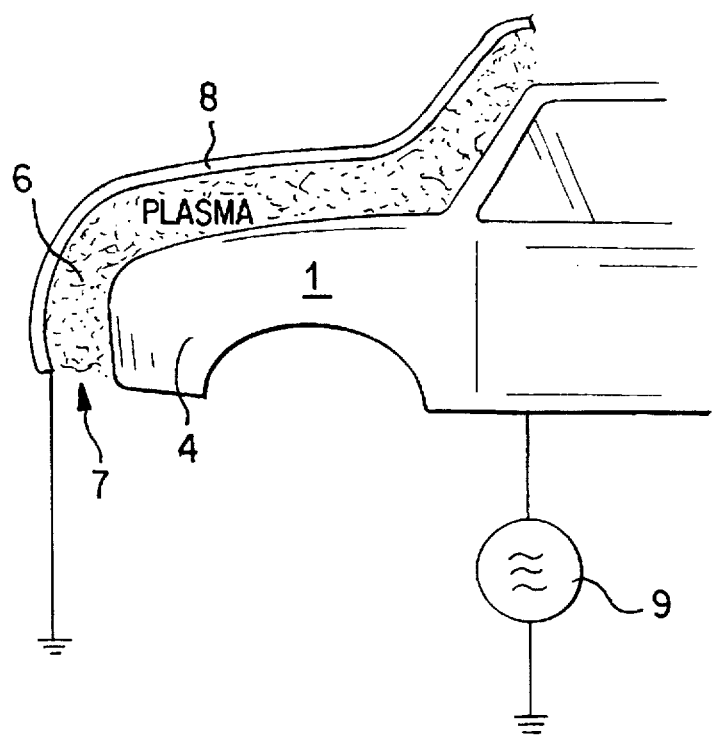
FIG. 1 shows an apparatus for producing a layer construction according to the invention.
Figure 2:
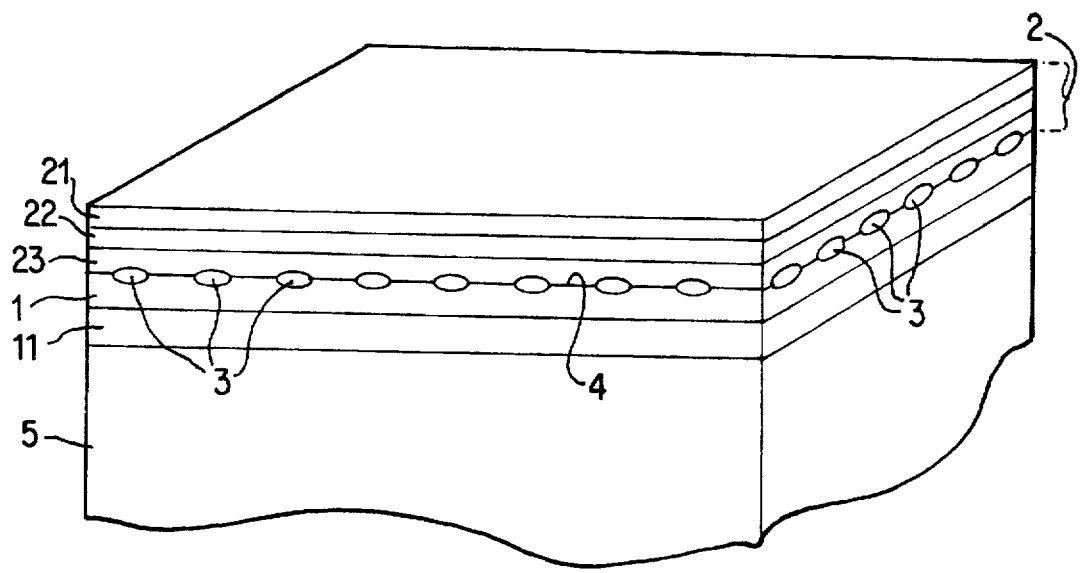
FIG. 2 shows a section through one possible layer construction comprising a metal sheet, a base lacquer, a clear lacquer and a diamond and/or diamond-like cover layer.
Figure 3:
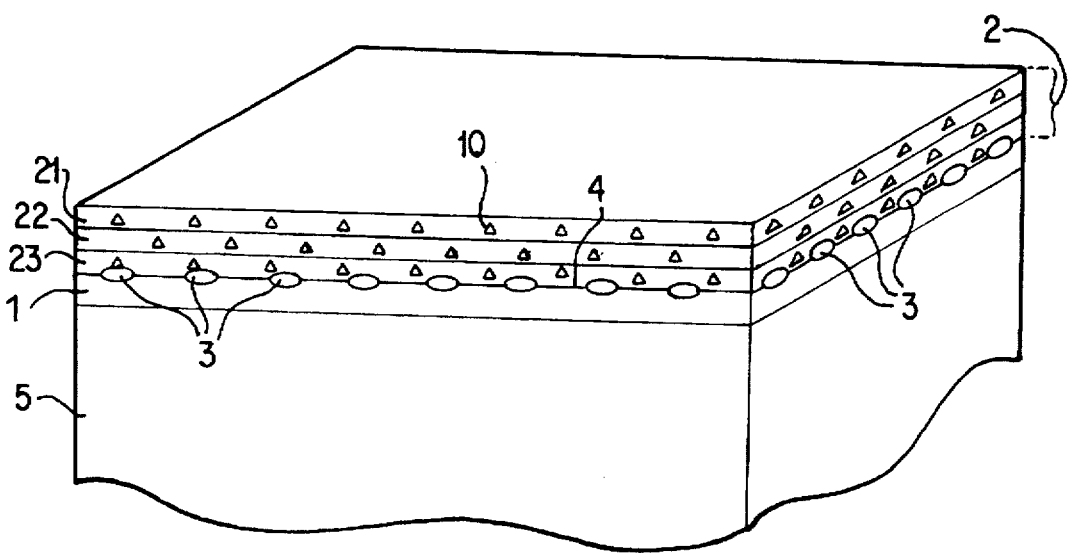
FIG. 3 shows a section through a layer construction substantially corresponding to the layer construction or FIG. 2 without the clear layer.

In FIG. 1, an apparatus for producing a layer construction with an organic layer 1 and a cover layer 2 which covers the organic layer 1 and which is harder than the organic layer 1 is illustrated (see FIGS. 2 and 3). In particular, the layer construction may be a painted sheet metal 5 of an automobile body. The apparatus which is constructed in the manner of a CVD (chemical vapor deposition) apparatus comprises a reactor, which is preferably evacuable. In the present example the interior of the wall 8 of the reactor advantageously is formed to correspond to the surface contour of the organic layer 1, whereby when the organic layer 1 is positioned in the reactor it is held approximately equidistant from the wall 8. In place of the wall 8 of the reactor, an electrode which likewise is formed to correspond to the contour of the exposed surface 4 of the organic layer 1 can also be arranged inside the reactor such that the electrode mounted an equidistant spacing from the organic layer 1 which lies opposite it prior to the application of the cover layer 2.

By evacuating the interior of the reactor, normal air which contains oxygen and other possibly interfering elements, is substantially removed from the vicinity which is relevant for the deposition of the cover layer 2. The evacuation of the reactor interior can be continued or repeated as needed in order to maintain the reduced pressure or the reactor interior can be at least partially filled with a desired gas. This depends on the desired process parameters for the deposition of the cover layer 2. Thus, for example, a step of providing growth nuclei on the surface 4 of the organic layer 1 which is freely exposed prior to application of the cover layer 2, which step is advantageously is undertaken before the deposition of the cover layer 2, may require the presence of a specific process gas in the vicinity of the deposition surface.

The apparatus further comprises a voltage supply 9 by means of which an electrical potential which is different from zero can be applied to the layer construction including the organic layer 1.

In order to produce a layer construction according to the invention, a metal sheet or panel 5, for example, which is provided with an organic layer 1 in the form of a clear lacquer which covers a colored base lacquer 11, is introduced into the reactor. The metal sheet 5 is thereby held in such a manner that the exposed surface 4 of the organic layer 1 lies opposite and is spaced an approximately equal distance from the wall 8 of the reactor which forms the electrode. In the reactor the exposed surface 4 is provided with growth nuclei 3 for the cover layer 2; the growth nuclei 3 being substances which have an $sp^2$ and/or an $sp^3$ hybridization of the bonding orbitals for the elements of the cover layer 5. The $sp^2$ and/or $sp^3$ hybridized bonding orbitals make these growth nuclei particularly suitable for promoting deposition of cover layers 2 which have a crystal lattice in which at least part of the elements which form the crystal likewise exhibit $sp^2$ and/or $sp^3$ bonding orbital hybridization.

In order to achieve a uniform application and bonding of the cover layer 2 subsequently arranged on the exposed surface 4, it is advantageous to distribute the growth nuclei 3 substantially uniformly over the surface of the exposed surface 4.

If a layer of diamond and/or of a diamond-like material is to be deposited as the cover layer 2, then expediently adamantane and/or congressane and/or organic molecules which contain corresponding homologs of the series of $sp^2$ hybridizing carbon agglomerates are advantageously used as materials for the growth nuclei 3.

In principle, the organic layer 1 can be provided with growth nuclei 3 in two ways. First, the growth nuclei 3 can be arranged or deposited on the organic layer 1. Alternatively, the growth nuclei 3 can be exposed from within the organic layer 1.

The arrangement or deposition of the growth nuclei 3 on the organic layer 1 can be achieved, for example, by mechanically rubbing powder into the organic layer 1; the powder consisting of the material from which the growth nuclei are formed. The particle size of the powder lies inter alia in the μm region or below.

Another possibility for arranging growth nuclei on the organic layer 1 is to deposit the growth nuclei on the organic layer 1 in a reactor by means of a CVD-like process. Prior to the deposition of growth nuclei 3 on the organic layer 1, it is advantageous to remove contaminants such as oxides and the like found on the organic layer 1. This can be achieved, in particular, by means of plasma cleaning. In the reactor, the growth nuclei 3 are deposited from a gas phase 7 comprising a nuclei-forming precursor material 6.

In order to improve the deposition of the growth nuclei on the organic layer 1, it is advantageous to apply a negative electric potential to the organic layer 1 relative to the nuclei-forming gas phase 7 by means of a voltage supply 9. Furthermore, it is advantageous to energetically excite the nuclei-forming precursor material 6 which is found in the gas phase 7. This excitation can be achieved by means of electromagnetic radiation, in particular by means of microwave and/or high frequency (i.e. radio frequency) and/or arc discharge and/or through any other type of plasma excitation.

Nuclei-forming precursor materials 6 having a composition corresponding to the formula $A*C_xH_yO_z+B*O_2+D*H_2$ wherein x=1 to 3,
y=4 to 8,
z=0 to 2, and
A+B+D=1000% have proved suitable as nuclei-forming precursor materials for the growth nuclei 3, particularly when cover layers 2 of diamond and/or diamond-like materials are to be deposited.

As previously mentioned, the organic layer 1 can also be provided with growth nuclei 3 by exposing growth nuclei 3 from within the organic layer 1. In this case, the growth nuclei 3 are already contained within the organic layer, for example as components mixed into the lacquer. In this regard it is of advantage that the growth nuclei 3 found in the organic layer 1 do not need to be present in their final molecular structure, whereby they can be more simply mixed into the organic layer 1, since in this way molecules or materials which are chemically and/or physically passive with respect to the materials of the organic layer 1 can be utilized for the growth nuclei 3. When exposed from within the organic layer 1, molecules or materials of this type used for the growth nuclei 3 must still be freed of side groups or other substituents found thereon. The exposure of the embedded growth nuclei can be effected by cleaning the exposed surface 4 by wet chemical etching. If a reactor, for example according to FIG. 1, is utilized, then the exposure of the growth nuclei can also be effected by plasma cleaning of the exposed surface 4.

In order to treat the surface of the organic layer 1 prior to the application of the cover layer 2, it may be advantageous in principle to combine the procedure for exposing the growth nuclei 3 and the procedure for arranging the growth nuclei 3 for the deposition process with each other.

The cover layer 2, which is harder than the organic layer 1, can be subsequently deposited on an organic layer 1 which has been prepared with growth nuclei 3. The deposition of the cover layer is desirably effected in a reactor gas by means of a CVD (Chemical Vapor Deposition) process, whereby the organic layer 1 which is to be coated with the cover layer 2 may be cleaned again and the cover layer 2 is deposited on the exposed surface 4 of the organic layer 1 from a depositing precursor material 6 which is present in a gas phase 7. The depositing precursor material optionally may correspond to the nuclei forming precursor material (previously likewise identified by reference numeral 6) in order to provide the exposed surface 4 with the growth nuclei 3 or the other known substances, i.e. hydrocarbons such as methane and the like. In order to better optically form the cover layer 2, it is deposited in the vicinity of the transition to the organic layer 1 with an index of refraction which deviates a maximum of 20%, in particular a maximum of 10%, from the index of refraction of the underlying organic layer 1. In order to improve the quality of the depositing cover layer 2, it is advantageous that, at least at the beginning of the application of the cover layer 2, a negative electrical potential relative to the depositing gas phase 7 is applied to the organic layer 1 by means of the voltage supply 9. The electrical potential applied to the organic layer 1 may amount up to −500 V, in particular up to −300 V.

The matching of the indices of refraction and additionally the matching of the mechanical characteristics, in particular to achieve the lowest possible strain at the boundary surface between the cover layer 2 and the organic layer 1, may be facilitated if the cover layer 2 is deposited as a plurality of individual layers 21, 22, 23. In order that a desired reflection will occur at the transitions (i.e. boundary surfaces) between the individual layers of the layer construction, the indices of refraction of the individual sublayers 21, 22, 23 may increase or decrease with increasing spacing from the organic layer 1; whereby the indices of refraction of successive individual layers 21, 22, 23 advantageously differ a maximum of 20%, in particular a maximum of 10%, from each other.

Diamond and/or diamond-like materials have proved especially suitable materials for the cover layer 2. Therefore, in a cover layer 2 formed from a plurality of individual layers 21, 22, 23, at least the outer individual layer 21 of the cover layer 2 should be formed of diamond or of a diamond-like substance.

FIG. 2 shows a section through one possible layer construction which comprises a metal sheet or panel 5 which is painted with a base lacquer 11 and with a clear lacquer which forms the organic layer 1, i.e., for example, an auto body panel of a motor vehicle. The cover layer 2, which in this case is deposited on the organic layer 1 formed of clear lacquer, is constructed of three individual layers 21, 22, 23, whereby at least the outer individual layer 1 of the individual layers 21, 22, 23 is formed of diamond and/or of a diamond-like material. Growth nuclei 3 are arranged on the surface 4 of the organic layer 1 formed by the clear lacquer, which surface 4 is freely exposed prior to the deposition of the cover layer 2. The growth nuclei 3 exhibit an $sp^2$ and/or an $sp^3$ hybridization of their bonding orbitals which are relevant for the cover layer 2, making them particularly suitable for a cover layer of diamond and/or a diamond-like material which exhibits a crystal structure.

As a result of providing the growth nuclei 3 uniformly distributed at a sufficiently high density on the surface 4 of the organic layer 1, which is freely exposed prior to the deposition of the cover layer 2, the cover layer 2 grows uniformly and continuously (i.e. without any interruptions). Consequently, cover layers 2 of this type exhibit a high quality with respect to their optical and mechanical properties.

In FIG. 3 a section through a further layer construction is illustrated which substantially corresponds to She layer construction according to FIG. 2. The layer construction according to FIG. 3, however, does not include a clear lacquer layer, so that in this case the organic layer 1 is formed by the base lacquer (identified in FIGURE 2 by the reference numeral 11). The cover layer 2 is constructed of a plurality of individual layers 21, 22, 23, whereby the individual layers 21, 22, 23 may be deposited with a crystal lattice structure in a simple and known manner. The cover layers 2 which exhibit a crystal lattice are advantageous, among other reasons, since these cover layers 2 can be doped with elements or materials which act as color centers 10 which selectively absorb light in the cover layer 2 as a result of electronic exchange effects in the atomic lattice of the cover layer 2. The multi-layer construction of the cover layer is also especially advantageous for facilitating simple matching of the index of refraction and of the mechanical properties at the transition between the boundary surfaces of the individual layers (organic layer 1/individual layers 21, 22, 23). Likewise, the multi-layer construction of the cover layer 2 is also advantageous if, depending on the desired reflection conditions, the index of the refraction of the cover layer 2 progressively increases or decreases with increasing spacing from the organic layer 1.

The color centers 10 have the advantage, particularly in transparent cover layers 2 with crystal lattices, that their color can be matched in a simple manner to the color of the previously applied lacquer.

Further, materials can be built into transparent layers 2, which exhibit optical effects which are based on the atomic influence of the these substances in the cover layer. Substances of this type can desirably be introduced as dopants in the cover layer 2. As a result of this possibility of doping, the optical utility and the optical quality of the cover layer can be increased.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A process for producing a multi-layer article comprising an organic layer and an adjoining cover layer which covers the organic layer and which is harder than the organic layer, said process comprising the steps of cleaning the organic layer, and depositing the cover layer on the cleaned organic layer by chemical vapor deposition of a precursor material from a gas phase, said cover layer being deposited at least in a transition region where the cover layer joins the organic layer with an index of refraction which is within 20% of that of the underlying organic layer.

2. A process according to claim 1, wherein the cover layer in said transition region has an index of refraction which is within 10% of that of the organic layer.

3. A process according to claim 1, wherein at least at the beginning of the deposition of the cover layer, an electrical potential which differs with respect to that of the gas phase is applied to the organic layer.

4. A process according to claim 1, wherein at least at the beginning of the deposition of the cover layer, the organic layer is raised to a negative electrical potential relative to the depositing gas phase.

5. A process according to claim 1, wherein said precursor has a composition corresponding to the formula

wherein x=1 to 3, y=4 to 8, z=0 to 2, and

A+B+D=100% and a cover layer of diamond or diamond-like material is deposited.

6. A process according to claim 1, wherein the precursor material in the gas phase is energetically excited.

7. A process according to claim 6, wherein the precursor material in the gas phase is energetically excited by means of plasma excitation.

8. A process according to claim 7, wherein the precursor material in the gas phase is energetically excited by means of electromagnetic radiation.

9. A process according to claim 7, wherein the precursor material in the gas phase is energetically excited by means of microwave energy, radio frequency energy or arc discharge.

10. A process according to claim 1, wherein the cover layer has an atomic lattice which is doped with at least one material which acts as a color center by selectively absorbing light due to electronic exchange effects in the atomic lattice of the cover layer.

11. A process according to claim 1, wherein said cleaning step comprises plasma cleaning the organic layer to remove contaminants found thereon.

12. A process according to claim 11, wherein said contaminants comprise oxides which interfere with deposition of the cover layer on the organic layer.

13. A process according to claim 1, further comprising, prior to depositing the cover layer, a step of providing growth nuclei exhibiting $Sp^2$ or $sp^3$ bonding orbital hybridization distributed substantially uniformly over the organic layer.

14. A process according to claim 13, wherein said growth nuclei are deposited on the organic layer by chemical vapor deposition.

15. A process according to claim 13, wherein said growth nuclei are initially contained in the organic layer and are exposed by etching away a portion of the organic layer.

16. A process according to claim 13, wherein said growth nuclei are initially contained in the organic layer and are exposed by plasma cleaning of the organic layer.

17. A process according to claim 13, wherein said growth nuclei are selected from the group consisting of adamantane, congressane and homologous $sp^2$ hybridizing carbon agglomerate organic molecules.

18. A process according to claim 17, wherein said cover layer is transparent and is composed of diamond or of a diamond-like material.

19. A process according to claim 13, wherein said growth nuclei are initially embedded in the organic layer and are exposed by removing a portion of the organic layer, and wherein upon exposure of the growth nuclei, side groups found on the growth nuclei are removed.

* * * * *